United States Patent
Nauta et al.

(10) Patent No.: US 7,606,343 B2
(45) Date of Patent: Oct. 20, 2009

(54) PHASE-LOCKED-LOOP WITH REDUCED CLOCK JITTER

(75) Inventors: Bram Nauta, Borne (NL); Remco Cornelis Herman Van De Beek, Enschede (NL); Cicero Silveira Vaucher, Eindhoven (NL)

(73) Assignee: NXP B.V., Eindhoven (NL)

( * ) Notice: Subject to any disclaimer, the term of this patent is extended or adjusted under 35 U.S.C. 154(b) by 662 days.

(21) Appl. No.: 10/503,187

(22) PCT Filed: Jan. 20, 2003

(86) PCT No.: PCT/IB03/00130

§ 371 (c)(1),
(2), (4) Date: Jul. 29, 2004

(87) PCT Pub. No.: WO03/065586

PCT Pub. Date: Aug. 7, 2003

(65) Prior Publication Data

US 2005/0084051 A1   Apr. 21, 2005

(30) Foreign Application Priority Data

Feb. 1, 2002   (EP) .................................. 02075424

(51) Int. Cl.
*H03D 3/24* (2006.01)
*H04B 3/46* (2006.01)
*H04L 7/00* (2006.01)

(52) U.S. Cl. ...................... 375/376; 375/226; 375/373; 375/374; 375/371

(58) Field of Classification Search ................ 375/226, 375/373, 376, 374, 371, 362
See application file for complete search history.

(56) References Cited

U.S. PATENT DOCUMENTS

| 4,244,043 | A | * | 1/1981 | Fujita et al. ................... 368/85 |
| 5,497,126 | A | * | 3/1996 | Kosiec et al. ............... 331/1 A |
| 6,100,767 | A | * | 8/2000 | Sumi .......................... 331/11 |
| 6,104,251 | A | * | 8/2000 | Ramey et al. ................. 331/14 |
| 6,114,888 | A | * | 9/2000 | Walley ....................... 327/157 |
| 6,151,076 | A | * | 11/2000 | Hoffman et al. ............ 348/512 |
| 6,154,071 | A | * | 11/2000 | Nogawa ..................... 327/156 |
| 6,236,278 | B1 | * | 5/2001 | Olgaard ....................... 331/25 |
| 6,265,947 | B1 | * | 7/2001 | Klemmer et al. .............. 331/17 |
| 6,437,616 | B1 | * | 8/2002 | Antone et al. ............... 327/158 |
| 6,486,741 | B2 | * | 11/2002 | Sumi .......................... 331/1 A |
| 6,504,415 | B1 | * | 1/2003 | Robinson et al. ............ 327/291 |
| 6,597,249 | B2 | * | 7/2003 | Chien et al. ............. 331/177 R |
| 6,791,379 | B1 | * | 9/2004 | Wakayama et al. ......... 327/156 |
| 6,901,127 | B1 | * | 5/2005 | Margules .................... 375/361 |
| 7,068,989 | B2 | * | 6/2006 | Yonekura .................... 455/260 |
| 7,082,178 | B2 | * | 7/2006 | Meltzer ....................... 375/376 |
| 2001/0026597 | A1 | * | 10/2001 | Komiyama ................. 375/316 |

(Continued)

*Primary Examiner*—Emmanuel Bayard

(57) ABSTRACT

The present invention relates to a phase-locked-loop (PLL) circuit and a method for controlling such a PLL circuit, wherein the frequency of an input reference signal and the frequency of a feedback signal derived from an output oscillation signal are divided by a predetermined rate to thereby reduce the frequency at a phase detection means (1) of the PLL circuit. The dividing step is inhibited in response to a detection of a phase-locked-state of the PLL circuit. Thus, after phase-lock has been achieved, extra reference dividers (6) added to decrease the comparison frequency are removed from the loop to thereby enable increase in the loop bandwidths and decrease in the dividing ratio within the loop.

9 Claims, 3 Drawing Sheets

U.S. PATENT DOCUMENTS

| | | | |
|---|---|---|---|
| 2002/0017956 A1* | 2/2002 | Sumi | 331/1 A |
| 2002/0109537 A1* | 8/2002 | Lee | 327/156 |
| 2002/0159130 A1* | 10/2002 | Sakano et al. | 359/326 |
| 2002/0163396 A1* | 11/2002 | Lim et al. | 331/179 |
| 2003/0112915 A1* | 6/2003 | Meltzer | 375/376 |
| 2005/0030073 A1* | 2/2005 | Wakayama et al. | 327/156 |
| 2005/0266817 A1* | 12/2005 | Welland et al. | 455/260 |

* cited by examiner

PHASE-LOCKED-LOOP WITH REDUCED CLOCK JITTER

The present invention relates to a phase-locked-loop (PLL) circuit for generating an oscillation signal in synchronism with an input reference signal, in particular to a PLL architecture incorporating a tri-state Phase-Frequency Detector (PFD).

A PLL is widely used as a generator for a reference frequency signal such as a clock signal in a micro processor and a local oscillation signal in a communication system and the like.

Standard Integer-N PLL architectures often incorporate a tri-state PFD which provides the advantage of being able to perform frequency discrimination, generating little reference breakthrough as compared to other detectors, and being edge triggered, which makes the phase detection performance independent of the duty cycle of the signals on the detector inputs.

In M. Soyuer and R. Meyer, "Frequency Limitations of a Conventional Phase-Frequency Detector", IEEE Journal of Solid State Circuits vol. 25, pp. 1019-1022, August 1990, it is demonstrated that conventional PFDs have an upper limit for the reference frequency at which frequency discrimination is possible. This upper limit is directly linked to the reset time of the PFD by the following equation:

$$f_{max} = 1/(2\Delta R),$$

wherein $\Delta R$ is the reset time of the PFD, which corresponds to the time needed to reset internal flops and includes internal delays of logic gates and the propagation time inside the flip-flops.

Thus, during a start-up procedure of the PLL where phase lock has not yet been achieved, a frequency higher that $f_{max}$ can lead to permanent frequency lock at wrong operation frequencies.

If a reference clock higher than $f_{max}$ is needed, there are basically two solutions given for the loop to be able to perform frequency discrimination:

1. Decreasing the reset time of the PFD, thus increasing $f_{max}$. However, this option is limited by the possibilities of the technology in which the PLL will be implemented.

2. Increasing the period of the reference signal at the input of the PFD, i.e. decreasing the comparison frequency. This may easily be achieved by preceding the PFD with a frequency divider (the reference divider) in order to divide the reference frequency down by a certain factor M. It is noted, that, in this case, the dividing ratio of the frequency divider inside the loop (the main divider) also needs to be multiplied by the same factor M to maintain a certain output frequency.

The second solution is an alternative often used in practice. FIG. 1 shows a principle block diagram of a PLL circuit in which the second solution is implemented. According to FIG. 1 the PLL includes a PFD 1, a charge pump circuit 2, a low-pass filter 3, a voltage controlled oscillator (VCO) 4 and a frequency divider 5. Furthermore, reference dividers 6 are provided at both inputs of the PFD 1 to thereby decrease the compared frequencies derived from an input reference signal and a feedback signal looped back from the output terminal via the frequency divider 5.

In operation, the PFD 1 supplies the charge pump circuit 2 with phase difference signals based on a phase difference between the compared signals at the input of the PFD 1. The charge pump circuit 2 converts the phase difference signals into an error signal, which exhibits a level change proportional to the phase difference between the compared signals. The error signal is then smoothed by the low-pass filter 3 to generate a control signal supplied to the VCO 4. The VCO 4 generates an output clock having an oscillation frequency which is controlled based on the voltage level of the control signal. The frequency divider 5 generates a divided signal by dividing the output clock at a predetermined dividing ratio N, thereby supplying the output thereof to the PFD 1. When the entire circuit has reached a steady or locked state of operation, i.e. a synchronized state after the synchronization transfer period, the frequencies and phases of the input reference signal and the divided signal looped back to the other input of the PFD 1 coincide with each other. Accordingly, the output clock supplied from the VCO 4 corresponds to a signal obtained by multiplying the input reference signal by the dividing ratio N.

The above mentioned synchronization transfer period corresponds to a transient period required for transferring the PLL into the locked state for synchronization and is determined by a sum of a pull-in period, referred to as a frequency synchronization period, and a locked-in period, referred to as a phase synchronization period.

However, the PLL arrangement shown in FIG. 1 has the following disadvantages.

The increased dividing ratio achieved by the reference dividers 6 in the loop increases the phase noise contribution from the PFD 1, charge pump circuit 2 and frequency divider 5, 6 to the loop. Furthermore, due to the fact that the maximum bandwidth is more or less proportional to the compared reference frequency, decreasing the reference frequency by a factor M means that the maximum loop bandwidth is scaled by the same factor M. This means that the time it takes for the loop to settle, i.e. the synchronization transfer period or settling time, is increased.

As a further disadvantage, the smaller loop bandwidth may degrade the output signal due to jitter caused by the VCO 4 and the low-pass filter 3. If the reference dividing ratio M equals two for example, the maximum loop bandwidth is two times lower than is allowed without the reference dividers 6. This means that the output jitter variance due to the phase noise of the VCO 4 and the thermal noise of a loop filter resistor provided in the low-pass filter 3 will be about twice as high as without the dividers.

It is therefore an object of the present invention to provide a PLL circuit and a method for controlling such a PLL circuit, by means of which a reference clock higher than the maximum allowed frequency of the PFD can be used without introducing the above disadvantages.

This object is achieved by a PLL circuit as claimed in claim 1 and a control method as claimed in claim 8.

Accordingly, the extra dividers are only introduced to enable frequency discrimination of the phase detection means before the PLL has achieved phase-lock. Thereby, a simple solution is provided, which avoids the drawbacks of the prior art. Due to the fact that the frequency dividing means are removed from the loop using the inhibiting means, an increase in the loop bandwidth and a decrease in the dividing ratio can be provided after phase-lock has been reached. Then, the only function of the phase detection means is to maintain the phase-lock, without the necessity for frequency discrimination. This means that the reset time of the phase detection means is allowed to be somewhat higher than half the period time of the reference signal. Therefore, the maximum operation frequency of a given phase detection means is extended without the drawbacks of the known second solution.

A further advantage of removing the extra dividers after phase-lock has been achieved is that the close-in phase noise power density drops by a factor $M^2$, while the increased loop-bandwidth results in a more effective suppression of the VCO and loop filter jitter.

Preferably, lock detecting means are provided for detecting the phase-locked state and for supplying an inhibition control signal to the inhibiting means.

Furthermore, the inhibiting means may comprise switching means for opening a connection between the frequency dividing means and the phase detection means. In this case, the switching means may be arranged to close respective by-pass connections for supplying the input reference signal and the feedback signal directly to the phase detection means, when the connection between the frequency dividing means and the phase detection means has been opened. The inhibition control signal may comprise a first control signal for opening the connection and the second control signal for closing the by-pass connection. The switching means may preferably be arranged to perform the switching in synchronism with the dividing operation of the frequency dividing means.

Further advantageous developments can be derived from the dependent claims.

In the following, the present invention will be described in greater detail on the basis of a preferred embodiment with reference to the accompanying drawings in which.

Figure 3:
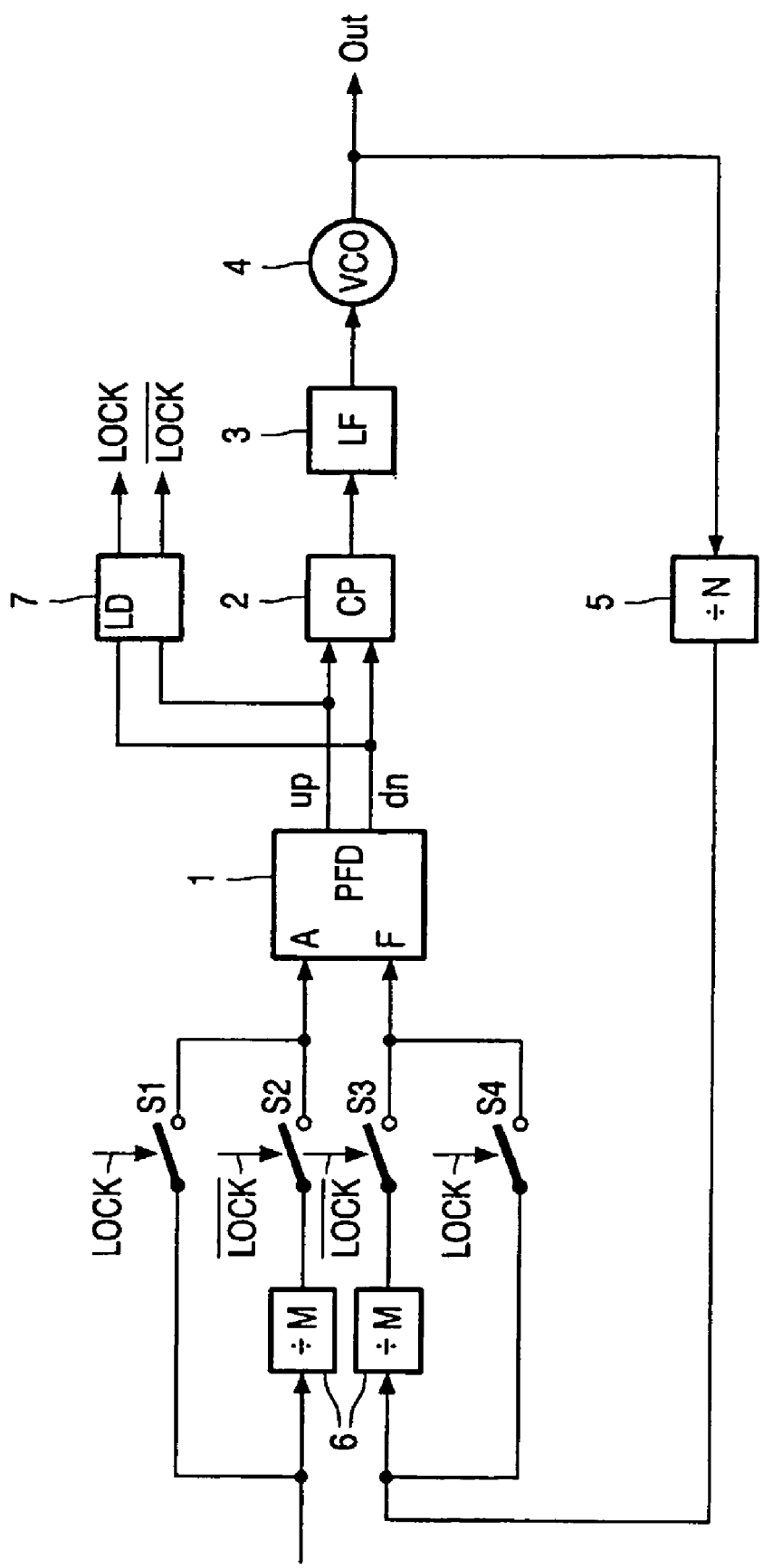
FIG. 3 shows a PLL circuit according to the preferred embodiment.

The preferred embodiment will now be described on the basis of an Integer-N PLL architecture incorporating a tri-state PFD 1 as shown in FIG. 3.

According to FIG. 3, a switching arrangement is provided which comprises switches S1 and S4 for closing a by-pass connection arranged for by-passing the reference dividers 6 and switches S2 and S3 for opening or closing a connection between the reference dividers 6 and the respective input terminals A, F of the PFD 1. The switching operation of the switches S1 to S4 is controlled by a control signal LOCK and an inverted control signal $\overline{LOCK}$ generated by a lock detection circuit 7. Due to the fact that the control signals LOCK and $\overline{LOCK}$ are of opposite logical states, the switches S1 and S4 are closed when switches S2 and S3 are opened and vice versa. Accordingly, the switching arrangement can be controlled to inhibit the frequency dividing operation of the reference dividers 6 in response to the control signals LOCK and $\overline{LOCK}$ generated by the lock detection circuit 7.

The lock detection circuit 7 is connected to the output terminals up, dn of the PFD 1.

Figure 2:
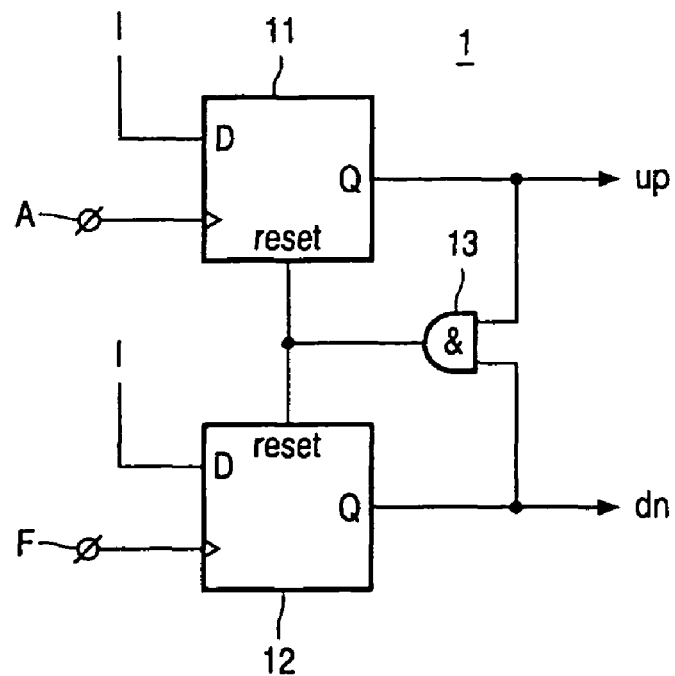
FIG. 2 shows a schematic circuit diagram of a PFD used in the PLL circuit according to the preferred embodiment.

FIG. 2 shows a schematic circuit diagram of the PFD 1 which consists of two D-Flip-Flops 11, 12 for outputting the respective logical output signals up and dn, respectively. The input terminals D of the D-Flip-Flops 11, 12 are set to the high logical level "1", and the input terminals A and F of the PFD 1 are connected to the edge triggered clock input terminals of the D-Flip-Flops 11, 12. A tri-state output stage 13 is provided by an AND-gate having its input terminals connected to the respective output terminals up and dn of the PFD 1, and having its output terminal connected to the reset terminals of both D-Flip-Flops 11, 12. The circuit basically functions as an up-down counter where a signal at the input terminal A causes a signal or up-count at the output terminal up corresponding to the respective D-Flip-Flop 11, and a signal at the other input terminal F of the PFD 1 causes a down-count at the corresponding output terminal dn of the other D-Flip-Flop 12. Thus, when the frequencies at the input terminals A, F of the PFD 1 are equal but the phase of the signal at the terminal A leads that of the signal at the terminal F, the output signal of the D-Flip-Flop 11 corresponding to the input terminal A is held "ON" or at the high logical level "1" for a time corresponding to the phase difference. When the phase of the signal at the input terminal A lags that of the signal at the input terminal F, the other output terminal dn is held "ON" or at the high logical level.

When the frequency of one of the input terminals A, F of the PFD 1 is higher than that of the other, the respective output terminal is held "ON" for most of the input signal cycle time, and for the remainder of the cycle both outputs up and dn are "OFF", i.e. high impedance state. Subsequently, the output voltage at the low-pass filter 3 varies until the input signals of the PFD 1 are equal in both phase and frequency. At this stabile point, the voltage at the output of the low-pass filter 3 remains constant.

Figure 4:
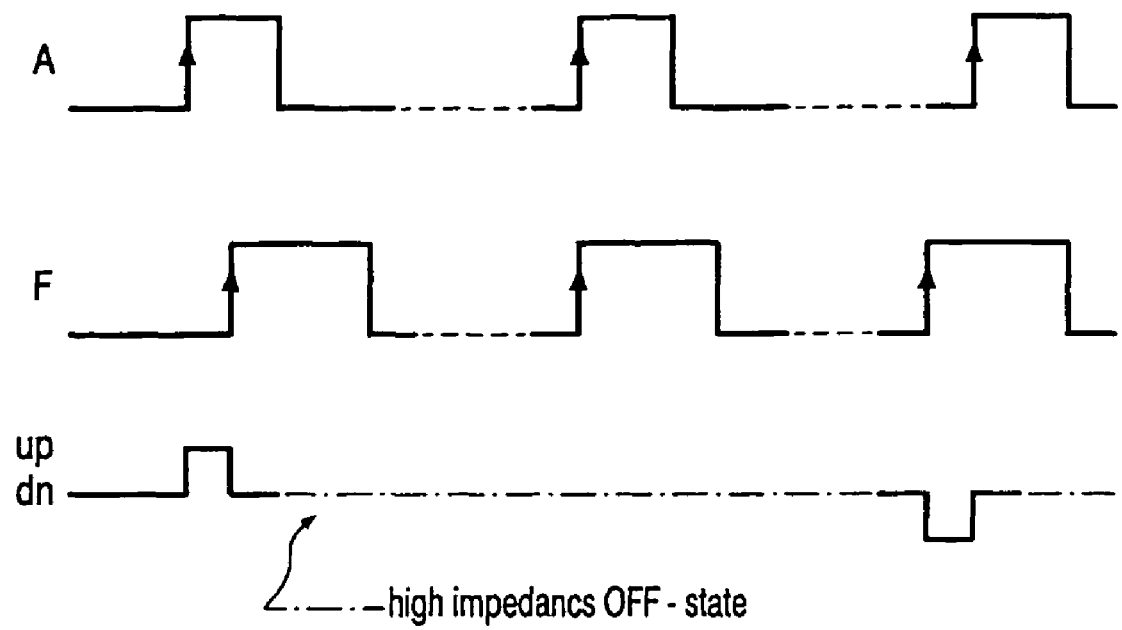
FIG. 4 shows a signaling diagram indicating input and output signals of the PFD shown in FIG. 2.

FIG. 4 shows respective waveforms at the input terminals A, F and a corresponding output signal which combines the signals at the output terminal up and dn to a single signal, wherein a positive pulse indicates a high logical level at the output terminal up and a negative pulse indicates a high logical level at the output terminal dn. As can be gathered from FIG. 4, a positive pulse (pulse of the up-signal) is obtained when the phase of the signal at the terminal A precedes, while a negative pulse (pulse of the dn-signal) is obtained, when the phase of the signal at the terminal F precedes.

The charge pump circuit 2 shown in FIG. 3 is arranged to generate an error signal which may be a current pulse of a constant magnitude and with a pulse width proportional to the phase error given by the difference output signals at the terminals up and dn. Namely, the output line of the charge pump circuit 2 is charged during a high level at the output terminals up and discharged during a high level at the output terminals dn. Thus, the charge from circuit 2 converts the phase difference output signals at the terminals up and dn into an error signal having a voltage level based on the phase difference between the compared signals at the input terminals A and F of the PFD 1.

The low-pass filter 3 shown in FIG. 3 may comprise a resistor and capacitor arrangement adapted to generate a control signal by smoothing the error signal output from the charge pump circuit 2. The VCO 4 then generates an output clock having an oscillation frequency controlled by the control signal. The frequency divider 5 divides the output clock of the VCO 4 to generate a feedback signal having a frequency equal to that of the input reference signal supplied to the upper one of the reference dividers 6.

Furthermore, the lock detection circuit 7 is arranged to judge the steady or lock state of the PLL by detecting a small phase error between the compared input signals of PFD 1. To remain in the locked state, the PLL circuit requires some small adjustments. The variation is dependent on the loop parameters and back-lash time, typically in the order of several ns. If the PLL circuit is in the locked state, only very small pulses will be output at the output terminals up and dn of the PFD 1.

Figure 5:
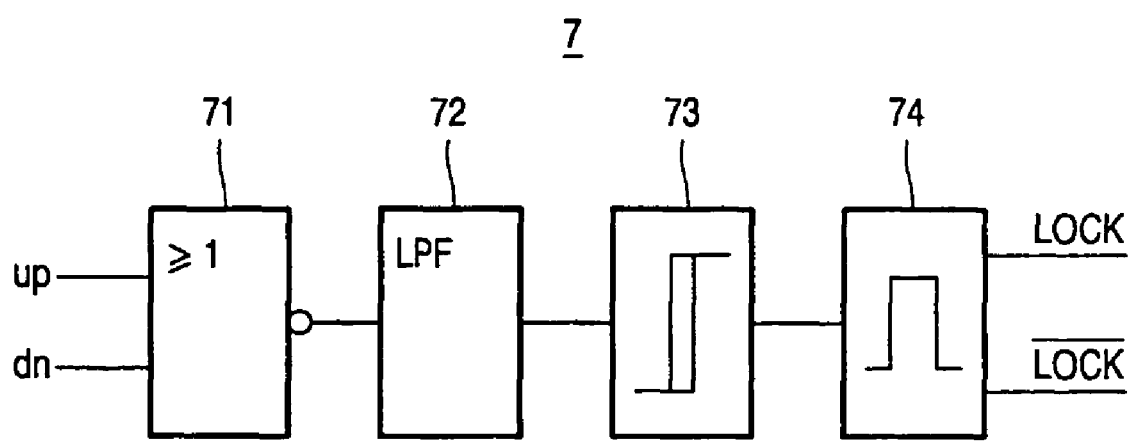
FIG. 5 shows a principal block diagram of a lock detection circuit used in the PLL circuit according to the preferred embodiment.

FIG. 5 shows a schematic block diagram of an exemplary implementation of the lock detection circuit 7. According to FIG. 5, the phase difference output signals at the terminals up and dn are combined in a NOR gate 71 arranged to produce a high level output signal if both input signals are at a logical low level "0". If at least one of the input signals supplied from the terminals up and dn of the PFD 1 is at a high level, the output of the NOR gate 71 will switch to the low level. Thus, in the locked state, the output signal of the NOR gate 71 is mainly at a high level state and changes to a low level state during the short pulses indicating the phase error. These pulses are filtered out by a low passed filter 72, i.e. an RC network or the like, and a Schmitt trigger circuit 73 produces a steady state level, wherein a high logical level indicates the locked state and a pulsed output indicates an out-of-lock state.

The output signal of the Schmitt trigger circuit 73 is supplied to the trigger input of a monostable flip-flop 74 which generates the control signals LOCK and $\overline{\text{LOCK}}$. During the locked state of the PLL, no output pulses are generated at the Schmitt trigger circuit 73 and the monostable flip-flop 74 maintains a low level state at its non-inverted Q output and a high level state at its inverted $\overline{Q}$ output. Thus, the $\overline{Q}$ output can be used for generating the control signal LOCK. On the other hand, in the out-of-lock state of the PLL circuit, pulses are generated at the output of the Schmitt trigger circuit 73, which continuously retrigger the monostabile flip-flop 74 to maintain its Q output at a high state, provided that the inherent time period of the monostable flip-flop 74 is set to a value higher than the maximum pulse period of the output signal of the Schmitt trigger circuit 73. Thus, the Q output of the monostabile flip-flop 74 can be used for generating the control signal $\overline{\text{LOCK}}$.

Figure 1:
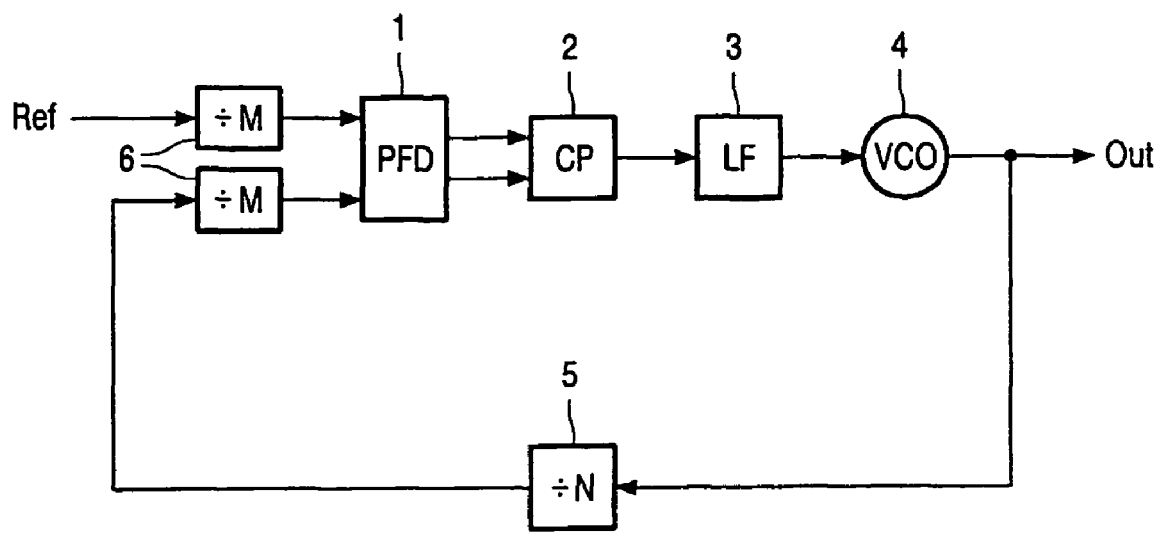
FIG. 1 shows a schematic block diagram of a conventional PLL architecture with reference dividers.

Thus, a simple solution is introduced to avoid the initially mentioned drawbacks of the conventional PLL circuit shown in FIG. 1. In summary, some time after phase (and frequency) lock has been achieved, the two extra reference dividers 6 which were added to decrease the reference frequency at the input of the PFD 1 are removed from the PLL loop using the switches S1 to S4, thereby enabling an increase in the loop bandwidth and decrease in the total dividing ratio. After phase-lock has been reached, the only function of the PFD 1 is to maintain the phase-lock without the necessity for frequency discrimination. This means that the reset time of the PFD 1 is allowed to be somewhat higher than half a period of the reference signal. Therefore, the maximum operation frequency of the PFD 1 can be extended without the drawbacks of the conventional PLL circuit shown in FIG. 1.

It is noted, that the removing or inhibiting of the extra reference dividers 6 "on-the-run" has to be performed in such a manner that phase disturbances are prevented in the loop, as this might force the loop out of lock. This may be achieved by linking the timing of switches S1 to S4 to the dividing states of the reference dividers 6, so that switching can be timed to occur just after the active edges of the output signals of the reference dividers 6 reach the edge triggered input terminals A and F of the PFD 1. Moreover, switching noise at the input terminals A and F of the PFD 1 should be prevented by corresponding circuit design matters.

The present invention is especially useful in systems where broadband PLLs with very high reference frequencies are to be used, for instance in clock conversion circuits for optical networks. In such a scenario, the PFD 1 could be designed to discriminate frequencies at a reference frequency of 625 MHz and could be used for "phase discrimination only" if operation at a reference frequency of 2.5 GHZ would be required.

It is noted that the present invention is not restricted to the specific circuit described in connection with the above preferred embodiment. Any kind of lock detection circuit arranged for generating a control signal indicating a locked state of the PLL can be used. The lock detection circuit may even be replaced by a simple timer circuit which counts a predetermined time period, e.g. one second, after the start of a synchronization operation, and then activates the inhibiting means, e.g. the switches S1 to S4, to inhibit the frequency dividing operation of the reference dividers 6 after the predetermined time period has elapsed. The predetermined time period has to be set to a value large enough to ensure that the PLL has reached the phase locked state. Any kind of inhibiting means could be implemented, which is suitable for inhibiting the function of the reference dividers 6 in response to the control signal obtained from the lock detection circuit 7 or the timer circuit. Thus, the present invention may vary within the scope of the attached claims.

The invention claimed is:

1. A phase-locked-loop circuit for generating an oscillation signal in synchronism with an input reference signal, said phase-locked-loop circuit comprising:
   a) phase detecting means for detecting a phase difference between a first signal derived from said input reference signal and a second signal derived from said oscillation signal, and for generating a control signal corresponding to said phase difference;
   b) frequency control means for controlling the frequency of said oscillation signal based on said control signal;
   c) frequency dividing means for dividing the frequency of said input reference signal by a factor M and dividing a feedback signal derived from said oscillation signal by the same factor M to generate said first and second signal, respectively; and
   d) inhibiting means for inhibiting the operation of said frequency dividing means, such that the frequency of said input reference signal is no longer divided by the factor M, and the feedback signal derived from said oscillation signal is no longer divided by the same factor M, when said phase-locked-loop circuit has reached a phase-locked state.

2. A circuit according to claim 1, further comprising lock detection means for detecting said phase-locked state and for supplying an inhibition control signal to said inhibiting means.

3. A circuit according to claim 1, further comprising timer means for counting a predetermined time period after the start of a synchronization operation, and for supplying an inhibition control signal to said inhibiting means when said predetermined time period has elapsed.

4. A circuit according to claim 2, wherein said inhibiting means comprises switching means for opening a connection between said frequency dividing means and said phase detection means (1) in response to said inhibition control signal.

5. A circuit according to claim 4, wherein said switching means is arranged to close respective by-pass connections for supplying said input reference signal and said feedback signal directly to said phase detection means, when said connection between said frequency dividing means and said phase detection means has been opened.

6. A circuit according to claim 5, wherein said inhibition control signal comprises a first control signal for opening said connection and a second control signal for closing said by-pass connections.

7. A circuit according to claim 4, wherein said switching means is arranged to perform said switching in synchronism with the dividing operation of said frequency dividing means.

8. A circuit according to claim 1, wherein said phase detection means is a phase and frequency detector.

9. A method of controlling a phase-locked-loop circuit, said method comprising the steps of:

a) dividing the frequency of an input reference signal of said phase-locked-loop circuit by a factor M and dividing a feedback signal derived from an oscillation signal by the same factor M;
b) supplying said divided input reference signal and said divided feedback signal to a phase detection means of said phase-locked-loop circuit; c) inhibiting said dividing step in response to a detection of a phase-locked state of said phase-locked-loop circuit such that the frequency of said input reference signal is no longer divided by the factor M, and the feedback signal derived from said oscillation signal is no longer divided by the same factor M; and
d) controlling the frequency of the oscillation signal based on a control signal corresponding to a detection of a phase difference between the input reference signal and the oscillation signal.

* * * * *